United States Patent
Lee et al.

(10) Patent No.: US 9,678,403 B2
(45) Date of Patent: Jun. 13, 2017

(54) TRANSMISSIVE OPTICAL SHUTTER AND METHOD OF FABRICATING THE SAME

(71) Applicant: SAMSUNG ELECTRONICS CO., LTD., Suwon-si (KR)

(72) Inventors: Sanghun Lee, Seoul (KR); Changyoung Park, Yongin-si (KR); Yonghwa Park, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/053,145

(22) Filed: Feb. 25, 2016

(65) Prior Publication Data
US 2017/0082905 A1    Mar. 23, 2017

(30) Foreign Application Priority Data
Sep. 21, 2015  (KR) .......................... 10-2015-0133094

(51) Int. Cl.
*G02F 1/21*     (2006.01)
*G02F 1/017*    (2006.01)
(Continued)

(52) U.S. Cl.
CPC .............. *G02F 1/218* (2013.01); *G02B 26/02* (2013.01); *G02B 26/04* (2013.01); *G02F 1/017* (2013.01); *G02B 5/003* (2013.01); *G02F 1/01716* (2013.01); *G02F 2001/0157* (2013.01); *G02F 2001/213* (2013.01); *H01L 51/5008* (2013.01)

(58) Field of Classification Search
CPC ...... G02B 5/003; G02B 5/0816; G02B 6/353; G02B 26/02; G02B 26/04; H01L 31/0232; H01L 51/44; H01L 51/441; H01L 51/442; H01L 51/50; H01L 51/5004; H01L 51/5008; H01L 51/5012; G02F 1/01; G02F 1/017; G02F 1/01716; G02F 1/01733; G02F 1/21; G02F 1/218; G02F 2001/0157; G02F 2001/213
USPC ......... 359/72, 237, 245–247, 254, 263, 279, 359/315, 318, 359, 361; 136/263
See application file for complete search history.

(56) References Cited

U.S. PATENT DOCUMENTS 5,578,820 A * 11/1996 Gadeken .................. G01V 5/06
                                                                                   250/256
5,625,729 A    4/1997 Brown
(Continued)

FOREIGN PATENT DOCUMENTS

| JP | 2006-293018 A | 10/2006 |
| KR | 10-2011-0086364 A | 7/2011 |

(Continued)

*Primary Examiner* — Loha Ben
(74) *Attorney, Agent, or Firm* — Sughrue Mion, PLLC (57) ABSTRACT

A transmissive optical shutter includes a first contact layer provided on a substrate; a plurality of stacks provided on the first contact layer, each stack of the plurality of stacks including a first reflective layer, an active layer, a second reflective layer, and a second contact layer sequentially provided on the first contact layer; a first electrode provided on the first contact layer; and a plurality of second electrodes respectively provided on corresponding second contact layers of the second contact layers of the plurality of stacks, each second electrode of the plurality of second electrodes being comb-shaped.

13 Claims, 8 Drawing Sheets

(51) Int. Cl.
*G02F 1/03* (2006.01)
*G02B 26/02* (2006.01)
*G02B 26/04* (2006.01)
G02F 1/015 (2006.01)
G02B 5/00 (2006.01)
H01L 51/50 (2006.01)

(56) References Cited

U.S. PATENT DOCUMENTS

| | | | |
|---|---|---|---|
| 6,249,370 B1 * | 6/2001 | Takeuchi | G02B 26/02 |
| | | | 345/85 |
| 6,501,778 B1 * | 12/2002 | Kondo | H01S 5/0425 |
| | | | 372/46.01 |
| 6,583,840 B1 * | 6/2003 | Inoue | G02F 1/134363 |
| | | | 349/113 |
| 6,901,182 B2 * | 5/2005 | Yeh | G02B 6/353 |
| | | | 385/140 |
| 7,436,066 B2 * | 10/2008 | Sonobe | H01L 33/40 |
| | | | 257/762 |
| 7,564,610 B2 * | 7/2009 | Fujimori | G02F 1/0555 |
| | | | 345/90 |
| 7,672,034 B2 * | 3/2010 | Fujimori | B82Y 20/00 |
| | | | 359/247 |
| 9,176,342 B2 * | 11/2015 | Ostergaard | G02B 6/001 |
| 2009/0073547 A1 | 3/2009 | Fujimori | |
| 2011/0181936 A1 | 7/2011 | Cho et al. | |
| 2012/0162380 A1 | 6/2012 | Cho et al. | |
| 2016/0057404 A1 | 2/2016 | Lee et al. | |

FOREIGN PATENT DOCUMENTS

| | | |
|---|---|---|
| KR | 10-2012-0075182 A | 7/2012 |
| KR | 10-2016-0022101 A | 2/2016 |

* cited by examiner

FIG. 6

TRANSMISSIVE OPTICAL SHUTTER AND METHOD OF FABRICATING THE SAME

CROSS-REFERENCE TO RELATED APPLICATION

This application claims priority from Korean Patent Application No. 10-2015-0133094, filed on Sep. 21, 2015 in the Korean Intellectual Property Office, the disclosure of which is incorporated herein in its entirety by reference.

BACKGROUND

1. Field

Methods and apparatuses consistent with exemplary embodiments disclosed herein relate to transmissive optical shutters and methods of fabricating the same.

2. Description of the Related Art

Recently, interest with respect to a three-dimensional (3D) camera module that provides a 3D image has increased. In particular, the demand for 3D content has increased, along with the development of a 3D display apparatus that displays a realistic 3-D image. Accordingly, many studies have been conducted about various apparatuses for obtaining a 3D image, by which a user may directly manufacture 3D content.

Depth information with respect to a distance between surfaces of an object and a 3D image pickup apparatus may be obtained by using a time-of-flight (TOF) method. The TOF method is a method of measuring an optical flight time of light that is irradiated from a laser beam to an object and is received by a light receiving unit after being reflected by the object. According to the TOF method, light having a specific wavelength (for example, infrared light having a wavelength of 850 nm or more) is irradiated to an object by using a light-emitting diode (LED) or a laser diode (LD). After receiving the light (reflected light) having the same wavelength reflected from the object, distance information is extracted. For example, after modulating an amplitude of the reflected light by using an optical shutter, a phase delay may be measured by capturing an image using an image pickup device, such as a charge coupled device (CCD) or a complementary metal-oxide semiconductor (CMOS) device. That is, a brightness image is obtained by accumulating or sampling the amount of light inputted to the image pickup device, and a phase delay and a distance may be calculated from the brightness image. According to the modulation method, in order to obtain an accurate phase delay, an optical shutter that may modulate light at a high speed of a few tens of MHz to a few hundreds of MHz is needed.

Recently, an optical shutter based on a gallium arsenide (GaAs) semiconductor that is easily realized, and may be operated at a low voltage but at very high speed while being small in size, has been proposed. The optical shutter based on the GaAs semiconductor has a structure in which a multiple quantum well (MQW) is disposed between a p type-electrode and an n-type electrode, and uses a phenomenon of absorbing light in the MQW when a reverse direction bias voltage is applied to both the p type-electrode and the n-type electrode. The optical shutters based on the GaAs semiconductor may be divided into two types including a reflective optical shutter and a transmissive optical shutter. In particular, when the transmissive optical shutter is used, the configuration of an optical system of a 3D image pickup apparatus is simple, and thus, the use of the transmissive optical shutter in the 3D image pickup apparatus may facilitate the miniaturization of the 3D image pickup apparatus.

In the optical shutter based on the GaAs semiconductor, a current should be rapidly and uniformly supplied from a p-type electrode disposed on a side of the optical shutter on which reflected light is incident, to a p-type GaAs layer formed below the p-type electrode.

SUMMARY

One or more exemplary embodiments provide transmissive optical shutters having improved uniformity of surface resistance in a p-type contact layer.

According to an aspect of an exemplary embodiment, there is provided a transmissive optical shutter including: a first contact layer provided on a substrate; a plurality of stacks provided on the first contact layer, each stack of the plurality of stacks including a first reflective layer, an active layer, a second reflective layer, and a second contact layer sequentially provided on the first contact layer; a first electrode provided on the first contact layer; and a plurality of second electrodes respectively provided on corresponding second contact layers of the plurality of stacks, wherein each second electrode of the plurality of second electrodes is comb-shaped.

The transmissive optical shutter may further include an insulating frame provided on the first contact layer, wherein portions of the insulating frame are formed in trenches between side surfaces of adjacent stacks of the plurality of stacks.

Each second electrode of the plurality of second electrodes may include: an electrode pad provided on the insulating frame on a side of the plurality of stacks; a first electrode connected to the electrode pad; a second electrode and a third electrode facing each other and extending parallel to each other in a first direction from respective corners of the first electrode; a plurality of first finger electrodes extending parallel to one another from the second main electrode towards the third main electrode; and a plurality of second finger electrodes extending parallel to one another from the third main electrode towards the second main electrode and alternately arranged with the first finger electrodes in the first direction.

The second electrode and the third electrode may be respectively provided on edges of each stack of the plurality of stacks.

The second electrode and the third electrode may be provided directly above a trench formed between adjacent stacks of the plurality of stacks.

A width of the first electrode, a width of the second electrode and a width of the third electrode may each be individually greater than individual widths of the first finger electrodes and individual widths of the second finger electrodes.

A wavelength band of light incident to the transmissive optical shutter may have a wavelength of at least 850 nm.

An upper surface of the insulating frame, which is a surface of the insulating frame opposite a surface of the insulating frame which contacts the first contact layer, may have a same height as upper surfaces of the plurality of stacks, which are surfaces of the plurality of stacks opposite surfaces of the plurality of stacks which contact the first contact layer.

The transmissive optical shutter may further include a passivation layer provided on the second contact layer to cover the plurality of second electrodes.

The first contact layer and the first reflective layers may be doped with a first conductive type impurity, and the second contact layers and the second reflective layers may be doped with a second conductive type impurity which is electrically opposite to the first conductive type impurity.

The transmissive optical shutter may further include a supporting layer provided on a lower surface of the substrate which is a surface of the substrate opposite to a surface of the substrate on which the first contact layer is provided.

The supporting layer may be formed of glass or sapphire.

The first electrode may surround and be spaced apart from the plurality of stacks provided on the first contact layer.

BRIEF DESCRIPTION OF THE DRAWINGS

These and/or other aspects will become apparent and more readily appreciated from the following description of exemplary embodiments, taken in conjunction with the accompanying drawings in which.

DETAILED DESCRIPTION

Reference will now be made in detail to exemplary embodiments, examples of which are illustrated in the accompanying drawings. In the drawings, thicknesses of layers and regions may be exaggerated for clarity of layers and region. The exemplary embodiments disclosed herein are exemplary only and may be embodied in many different forms.

It will be understood that when an element or layer is referred to as being "on or above" another element or layer, the element or layer can be directly or indirectly formed on the other element or layer.

Figure 1:
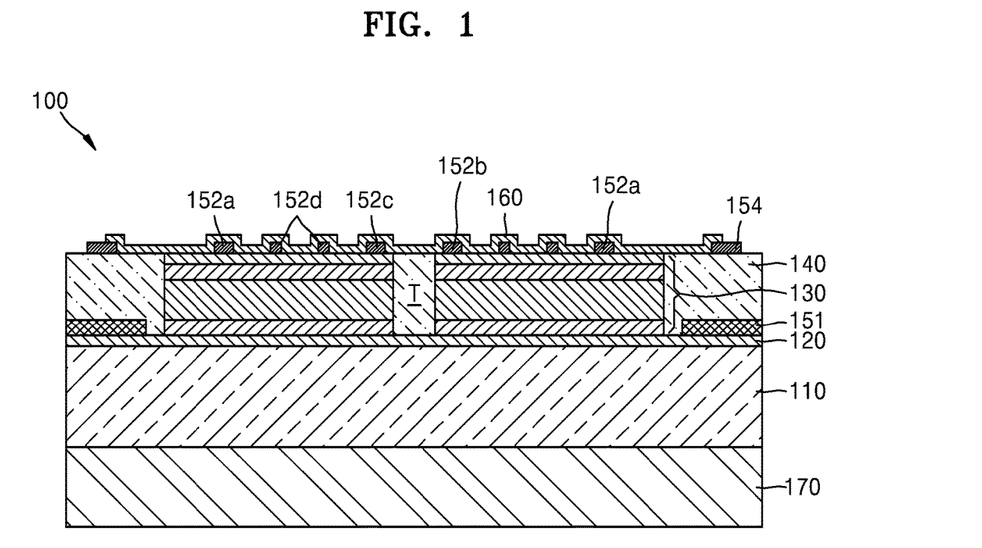
FIG. 1 is a schematic cross-sectional view of a configuration of a transmissive optical shutter according to an exemplary embodiment.
Figure 2:
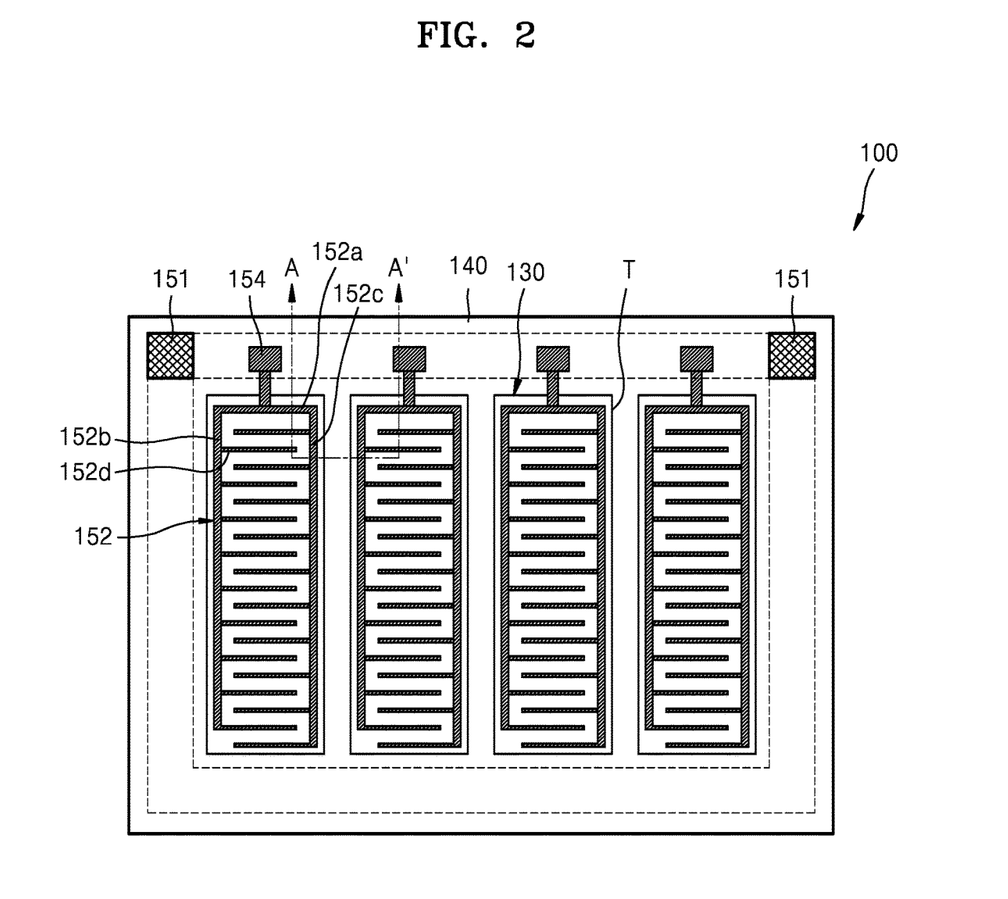
FIG. 2 is a schematic plan view of a transmissive optical shutter according to an exemplary embodiment.
Figure 3:
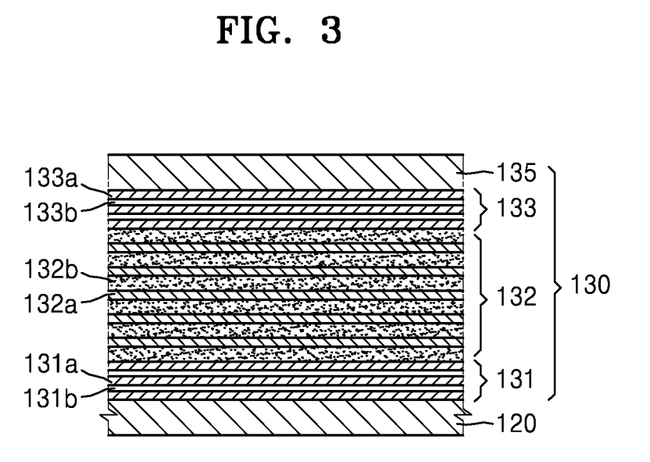
FIG. 3 is a schematic cross-sectional view of a structure of a stack of a transmissive optical shutter according to an exemplary embodiment.

FIG. 1 is a schematic cross-sectional view of a configuration of a transmissive optical shutter 100 according to an exemplary embodiment. FIG. 2 is a schematic plan view of the transmissive optical shutter 100 according to an exemplary embodiment, and for convenience of explanation, some of the constituent elements are omitted in FIG. 2. FIG. 3 is a schematic cross-sectional view of a structure of the stacks 130 of the transmissive optical shutter 100 according to an exemplary embodiment. FIG. 1 is a cross-sectional view taken along a line A-A' of FIG. 2.

Referring to FIG. 1, the transmissive optical shutter 100 according to the exemplary embodiment includes a first contact layer 120 provided on a substrate 110, a plurality of stacks 130 on the first contact layer 120, and an insulating frame 140 that surrounds sidewalls of the stacks 130.

A first electrode 151 is formed on the first contact layer 120. A second electrode 152 is formed on the stack 130.

The first contact layer 120 may be doped with an n-type impurity or a p-type impurity. Hereinafter, for convenience of explanation, a configuration in which the first contact layer 120 is doped with an n-type impurity will be described. The first electrode 151 may be an n-type electrode, and the second electrode 152 may be a p-type electrode.

The first electrode 151 may have an annular shape that surrounds the stacks 130. The first electrode 151 may be formed such that at least two regions thereof are exposed by the insulating frame 140, and thus, even if an electrical connection of the first electrode 151 to an external voltage is disconnected at one of the regions, the electrical connection may be connected at the other region.

A passivation layer 160 that covers the second electrode 152 may be formed on the stacks 130, and a supporting layer 170 may be formed below the substrate 110.

The substrate 110 may be formed of, for example, Si, GaAs, SiC, etc. Light enters the transmissive optical shutter 100 and is incident to a light receiving unit disposed under the substrate 110 by being transmitted through the substrate 110. According to an exemplary embodiment, the substrate 110 may be formed of GaAs which is a III/V compound semiconductor. When the substrate 110 is formed of GaAs, the degree of transmission differs according to a wavelength band of incident light. In the case of a transmissive optical shutter that uses a short wavelength band, for example, an infrared ray band that is an 850 nm wavelength band, the GaAs substrate 110 may not transmit the wavelength band of 850 nm, and an opening should be formed in the substrate 110 by removing a region corresponding to the stacks 130. However, in the case of the transmissive optical shutter 100 that uses a long wavelength band of, for example, a 940 nm wavelength band, the substrate 110 may transmit the 940 nm wavelength band, and thus, the transmissive optical shutter 100 may be formed without forming the opening in the substrate 110. In this case, since an additional process for forming the opening is unnecessary, production yield may be increased by reducing manufacturing processes.

The stacks 130 modulate the intensity of incident light having a specific wavelength by using an opto-electro absorption effect. For this purpose, the stacks 130, as shown in FIG. 3, may have a Fabry-Perot resonance structure in which an active layer 132 is disposed between first and second reflective layers 131 and 133.

For example, the active layer 132 may be a multiple quantum well (MQW) that includes a plurality of barrier layers 132b formed of AlGaAs and a plurality of quantum well layers 132a formed of GaAs. Also, the active layer 132 may perform as a main cavity for generating a Fabry-Perot resonance. For this purpose, the active layer 132 may be formed to have an optical thickness (that is, a value obtained by multiplying a refractive index of a layer by a physical thickness) of approximately an integer multiple of $\lambda/2$ (here, $\lambda$ is a wavelength of an incident light to be modulated or a resonance wavelength). For example, in the transmissive optical shutter 100, $\lambda$ may be a wavelength greater than 850 nm in an infrared ray region, and in the transmissive optical shutter 100 according to an exemplary embodiment, $\lambda$ may be a wavelength of approximately 940 nm.

The first and second reflective layers 131 and 133 may be distributed Bragg reflectors (DBRs) having a structure in which low reflective index layers 131a and 133a having relatively low reflective indexes and high reflective index layers 131b and 133b having relatively high reflective indexes are repeatedly and alternately stacked. An optical thickness of each of the low reflective index layers 131 a and 133a and the high reflective index layers 131 b and 133b may be approximately a multiple of an odd number of λ/4. The first and second reflective layers 131 and 133 may have approximately the same reflectivity. Also, the first and second reflective layers 131 and 133 may perform as a path of current to provide a current to the active layer 132. For this purpose, the first and second reflective layers 131 and 133 may be doped with opposite impurities to each other. For example, the first reflective layer 131 may be an n-DBR layer doped with an n-type impurity and the second reflective layer 133 may be a p-DBR layer doped with a p-type impurity. Alternatively, the first reflective layer 131 may be a p-DBR layer and the second reflective layer 133 may be an n-DBR layer.

FIG. 3 is a schematic cross-sectional view of a structure of the stacks 130 of the transmissive optical shutter 100 according to an exemplary embodiment. In order to improve a bandwidth and a demodulation contrast of the transmissive optical shutter 100, the stacks 130 may be modified in various ways from the structure depicted in FIG. 3. For example, an additional cavity may further be formed in at least one of the first and second reflective layers 131 and 133. Also, the active layer 132 may include a plurality of the quantum well layers 132a having different optical thicknesses from each other. Also, three or more reflective layers and two or more active layers may be alternately disposed. The structure of the stacks 130 according to exemplary embodiments is not limited to any of the above-described particular configurations, and the stacks 130 may have any structure that may modulate light of a specific wavelength by using the opto-electro absorption effect.

In order to achieve an optical modulation at a high speed through reduction of capacitance, the stacks 130 may be formed as a plurality of small cells instead of being formed as a large single cell. For example, in the plan view of FIG. 2, the stacks 130 are formed as four separated cells. However, the structure of the stacks 130 according to exemplary embodiments is not limited thereto, that is, the stacks 130 may be a plurality of cells arranged in a one-dimensional or two-dimensional array of an arbitrary n x m number of cells (n and m are natural numbers greater than 1), according to design considerations. Trenches T may be formed between the stacks 130. The first contact layer 120 is exposed by the trenches T. The trenches T electrically divide the stacks 130.

The first contact layer 120 and a second contact layer 135 are electrically connected to the first and second electrodes 151 and 152. The first contact layer 120 may be disposed on the substrate 110 and the stacks 130 may be disposed on the first contact layer 120. The first reflective layer 131 of the stacks 130 may contact the first contact layer 120. The second reflective layer 133 may contact the second contact layer 135. When the stacks 130 are separated into two cells or more, the second contact layer 135 may be formed on each of the cells. For example, the first contact layer 120 may be formed of a semiconductor material including InGaP. Also, the second contact layer 135 may be formed of a material that transmits light of a resonance wavelength and electrically contacts another electrical component. For example, the second contact layer 135 may be formed of a semiconductor material including InGaP or GaAs.

The first contact layer 120 may be doped with the same impurity type doped in the first reflective layer 131 and the second contact layer 135 may be doped with the same impurity type doped in the second reflective layer 133. For example, if the first reflective layer 131 is doped with an n-type impurity and the second reflective layer 133 is doped with a p-type impurity, the first contact layer 120 may be formed of n-InGaP and the second contact layer 135 may be formed of p-InGaP or p-GaAs. Also, if the first reflective layer 131 is doped with a p-type impurity and the second reflective layer 133 is doped with an n-type impurity, the first contact layer 120 may be formed of p-InGaP and the second contact layer 135 may be formed of n-InGaP or n-GaAs.

According to an exemplary embodiment, since the overall thickness of the stacks 130 is approximately 5 μm, the stacks 130 may be chemically and physically weak. Accordingly, the transmissive optical shutter 100 may further include the insulating frame 140 to protect the stacks 130. The insulating frame 140 may be formed to cover the trenches T between the stacks 130 and the sidewalls of the stacks 130 on the first contact layer 120. Some portions of the first electrode 151 are exposed by the insulating frame 140. The exposed first electrode 151 may be connected to an external power source via a wire.

The insulating frame 140 may be formed of an insulating material having a low dielectric constant to minimize the generation of parasitic capacitance. For example, the insulating frame 140 may be formed of a material, such as, benzocylobutene (BCB) or polyimide.

The first electrode 151 and the second electrode 152 may be formed of a metal or a metal oxide having conductivity. The second electrode 152 may be disposed on each of the stacks 130. The second electrode 152 may include a plurality of wires that are separately disposed and spaced apart from each other by predetermined spaces in order to increase the injection efficiency of a current while minimizing the blocking of light. The second electrode 152 may be formed as, for example, a comb type electrode.

An electrode pad 154 for connecting the second electrode 152 to an external power source may be formed on an upper surface of the insulating frame 140. The second electrode 152 may include a first main electrode 152a connected to the electrode pad 154, a second main electrode 152b connected to an edge (e.g., corner) of the first main electrode 152a, and a third main electrode 152c connected to another edge (e.g., another corner) of the first main electrode 152a. The second main electrode 152b and the third main electrode 152c may be disposed parallel to each other. The first through third main electrodes 152a, 152b, and 152c may be disposed on three edges of the second contact layer 135 of each of the stacks 130. A plurality of finger electrodes 152d may be formed on the second and third main electrodes 152b and 152c which face each other. The finger electrodes 152d formed on the second electrodes 152b may extend towards the third main electrodes 152c, and the finger electrodes 152d formed on the third electrodes 152c may extend towards the second main electrodes 152b. The finger electrodes 152d on the second main electrode 152b and the finger electrodes 152d on the third main electrode 152c may be alternately formed with respect to each other in a direction parallel to a direction in which the second and third main electrodes 152b and 152c extend. The first through third main electrodes 152a, 152b, and 152c may have a width greater than that of the finger electrodes 152d, although are not limited thereto.

The passivation layer 160 may be formed to protect the second contact layer 135 and the second electrode 152 on the stacks 130, and may be formed of $SiO_2$, etc.

The supporting layer 170 is formed to support the transmissive optical shutter 100 disposed on the substrate 110, and may be formed of a transparent material, such as, glass, sapphire, plastic, etc. Accordingly, light incident on the supporting layer 170 may pass through the supporting layer 170.

The transmissive optical shutter 100 according to an exemplary embodiment may reduce a surface resistance at edges of the second contact layers 135 of the cells due to the configuration of the first through third main electrodes 152a, 152b, and 152c, and may thus provide uniform light.

Also, a current supplied to the finger electrodes 152d from the electrode pad 154 through the second main electrode 152b and the third main electrode 152c flows in opposite directions from each other and a structure of the second electrode 152 is an open type, that is, an end of the second main electrode 152b and an end of the third main electrode 152c are separated from each other (bottom ends in FIG. 2). Thus, the electro-magnetic interference (EMI) effect that may occur at a driving frequency of 20 MHz or above may be reduced.

FIGS. 4A, 4B, 4C, 4D, 4E, 4F and 4G are schematic cross-sectional views illustrating a method of manufacturing a transmissive optical shutter 100 according to an exemplary embodiment.

Figure 4A:
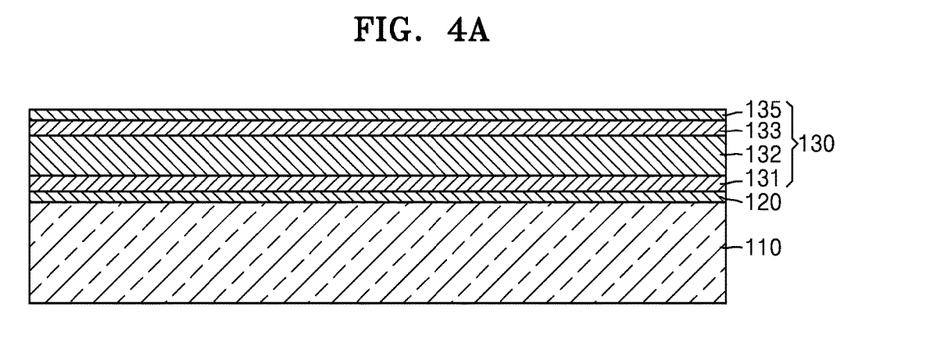
FIGS. 4A, 4B, 4C, 4D, 4E, 4F and 4G are schematic cross-sectional views illustrating a method of manufacturing a transmissive optical shutter according to an exemplary embodiment.

Referring to FIG. 4A, a first contact layer 120, a first reflective layer 131, an active layer 132, a second reflective layer 133, and a second contact layer 135 are epitaxially and sequentially grown on an upper surface of a substrate 110, for example, a substrate formed of GaAs. The first contact layer 120 may be formed of n-InGaP. The first reflective layer 131 may be doped with an n-type impurity, the second reflective layer 133 may be doped with a p-type impurity. The second contact layer 135 may be formed of p-InGaP or p-GaAs.

Figure 4B:
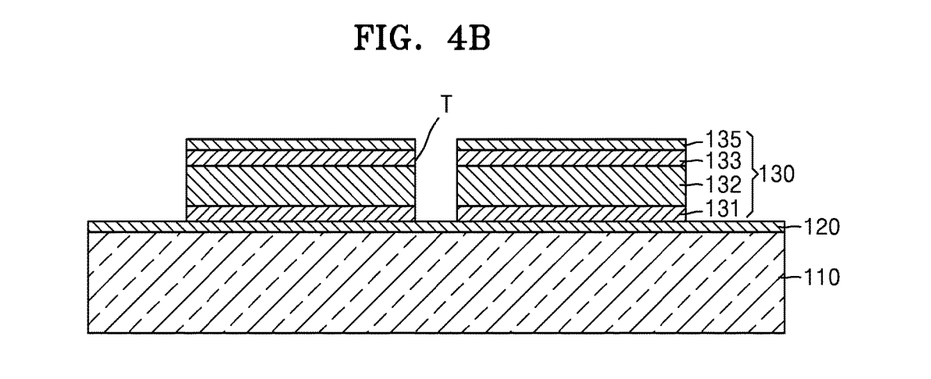

Referring to FIG. 4B, a plurality of stacks 130 may be formed by mesa etching the second contact layer 135, the second reflective layer 133, the active layer 132, and the first reflective layer 131. The mesa etching is performed until the first contact layer 120 is exposed. Trenches T may be formed between the stacks 130. The stacks 130 may be arranged in an array type.

Figure 4C:
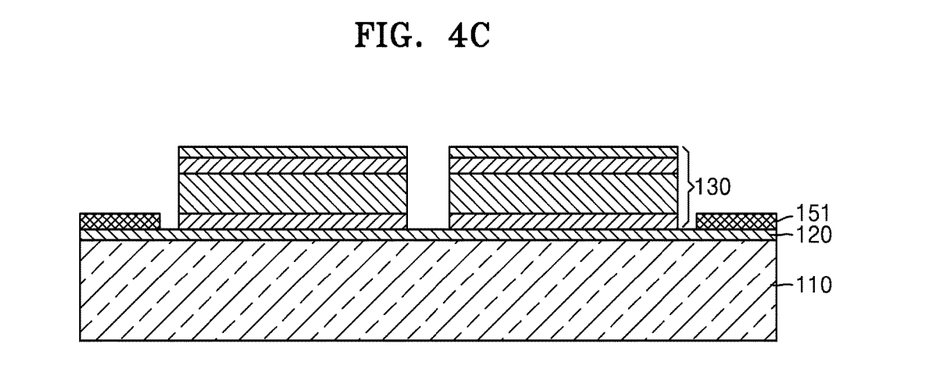

Referring to FIG. 4C, a first electrode 151 is formed on an upper surface of the exposed first contact layer 120. The first electrode 151 may be formed as a rectangular and annular shape that surrounds the stacks 130, although is not limited thereto, and may also be formed as other shapes, including shapes having various straight and/or curved portions, etc.

Figure 4D:
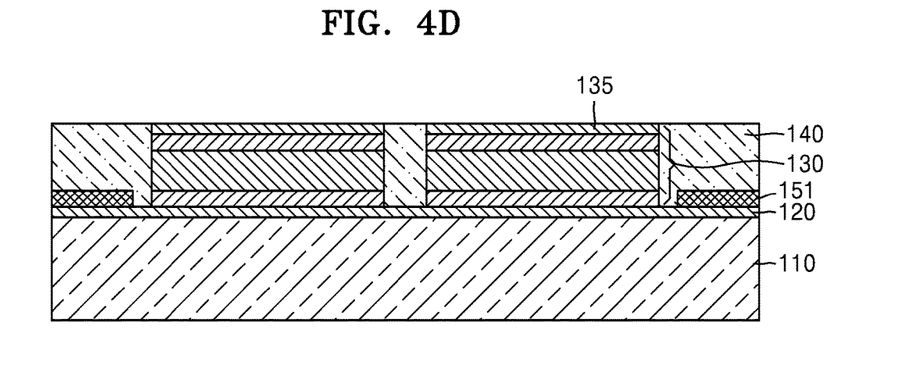

Referring to FIG. 4D, an insulating frame 140 may be formed to cover the first electrode 151 and surround sidewalls of the stacks 130 on the first contact layer 120. The insulating frame 140 may be filled in the trenches T between the stacks 130. Some parts of the first electrode 151 are exposed as a result of removing portions of the insulating frame 140. An upper surface of the insulating frame 140 may be formed to have the same height as that of the second contact layer 135, to create a continuously planar upper surface and avoid creating a step.

Figure 4E:
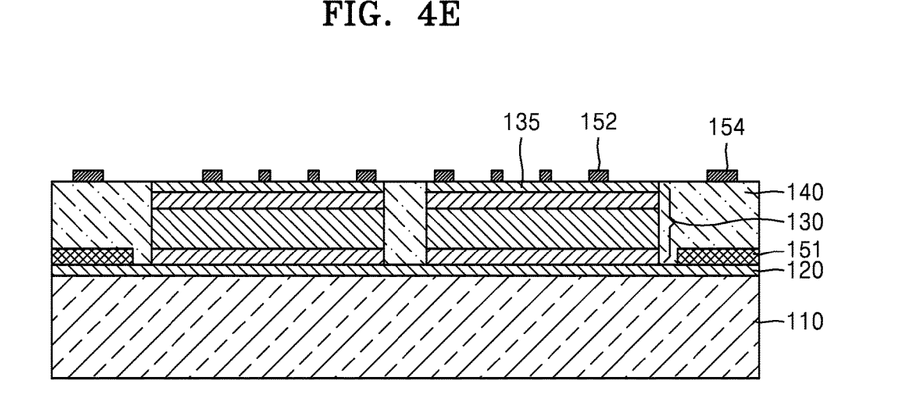

Referring to FIG. 4E, a second electrode 152 may be formed on the second contact layer 135 and electrode pads 154 may be formed on the insulating frame 140. The second electrode 152 and the electrode pad 154 may be simultaneously formed by using the same material. For example, after forming a single conductive material layer on the upper surfaces of the second contact layer 135 and the insulating frame 140, the second electrodes 152 and the electrode pads 154 may be formed by patterning the conductive material layer.

Figure 4F:
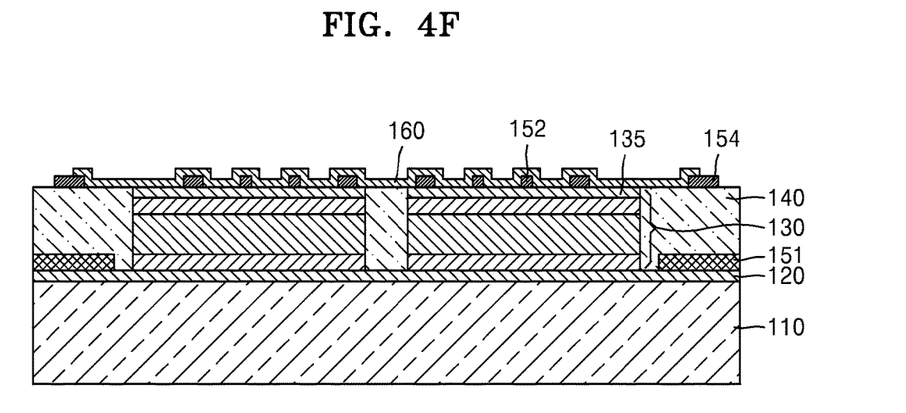

Referring to FIG. 4F, a passivation layer 160 may be formed to cover the second contact layer 135 and the second electrodes 152. The passivation layer 160 may be formed of, for example, $SiO_2$, etc. After forming the passivation layer 160 with a constant thickness over a surface or surfaces of the second electrodes 152, the electrode pads 154, the second contact layer 135, and the insulating frame 140, some portions of the passivation layer 160 formed on the electrode pad 154 may be removed. Thus, the passivation layer 160 that covers the second electrodes 152 and extends to contact a portion of an upper surface of the electrode pad 154 may be formed.

As described above, according to the transmissive optical shutter according to an exemplary embodiment, which is configured to receive light of a specific wavelength band, for example, a 940 nm wavelength band, an additional process for forming an opening in the substrate 110 formed of GaAs is unnecessary. Thus, a process for removing a portion of the substrate 110, for example, an additional etching process with respect to the substrate 110, may be omitted. Accordingly, a production yield may be increased by simplifying the overall manufacturing process.

To manufacture the transmissive optical shutter 100 according to an exemplary embodiment, since the processes depicted in FIGS. 4A through 4F may be performed by using a method such as, for example, a chemical vapor deposition (CVD) method used in a semiconductor wafer process, the processes depicted in FIGS. 4A through 4F may be performed at a wafer level, and thus, a mass production of the transmissive optical shutter may be possible. Also, after the process depicted in FIG. 4F is completed, a plural number of transmissive optical shutters 100 formed on a single wafer may be diced.

Figure 4G:
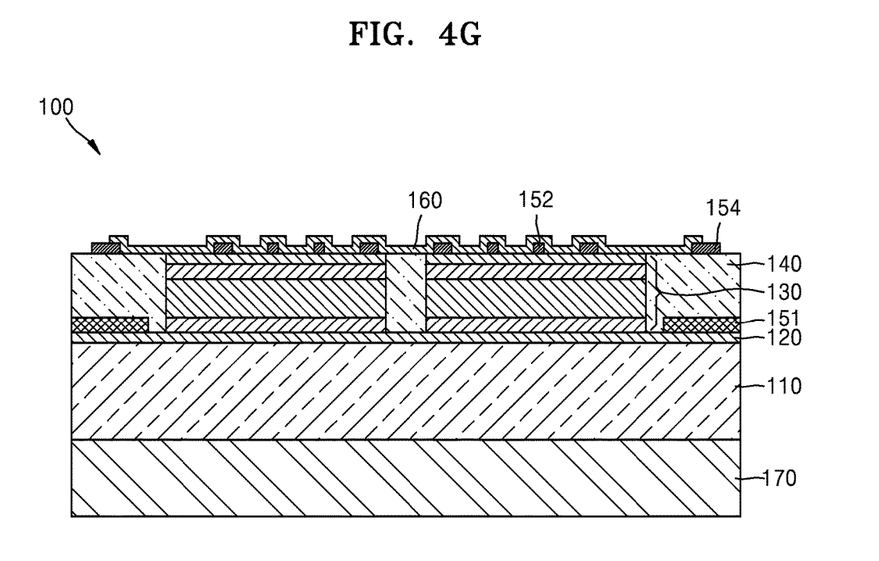

Referring to FIG. 4G, a supporting layer 170 is attached to a lower surface of the substrate 110 to support the transmissive optical shutter 100. To bond the supporting layer 170 to the substrate 110, a transparent adhesive that may transmit light of a specific wavelength band, for example, a wavelength of 940 nm, may be used. For example, an adhesive which is a transparent epoxy may be used. The supporting layer 170 may be formed of a transparent material, such as glass or sapphire.

Figure 5:
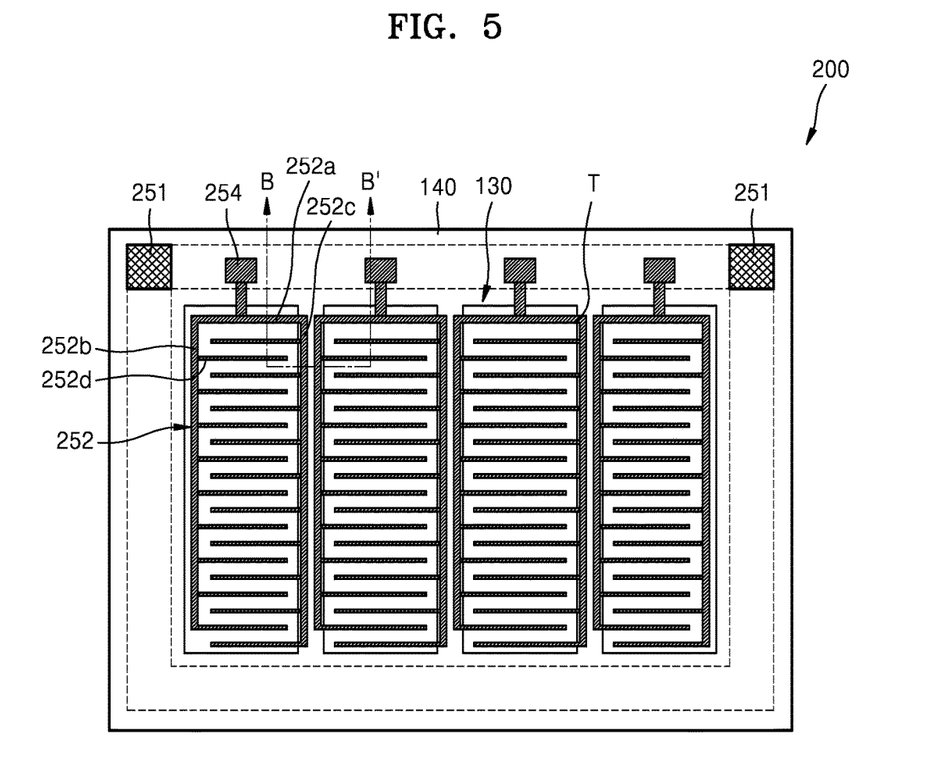
FIG. 5 is a plan view of a transmissive optical shutter according to another exemplary embodiment.
Figure 6:
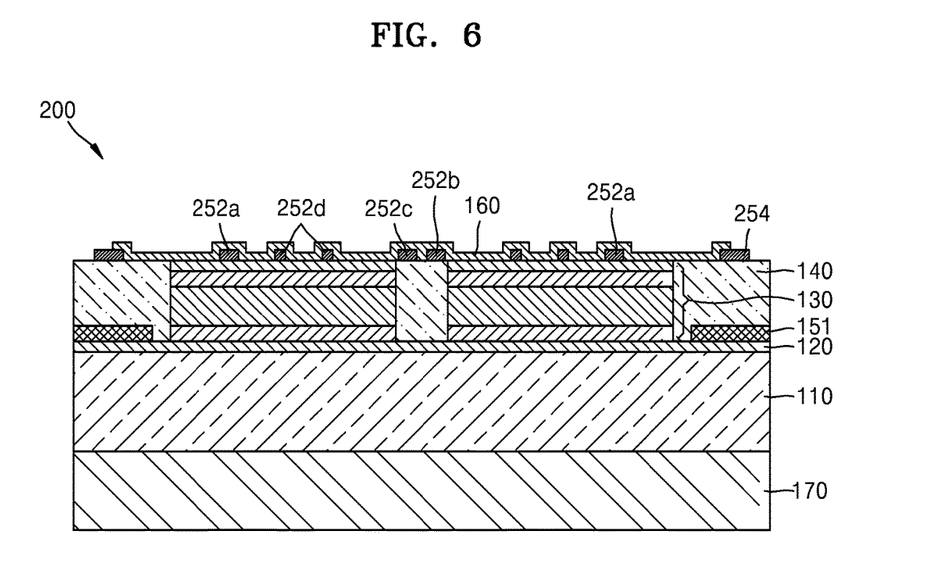
FIG. 6 is a cross-sectional view taken along a line B-B' of FIG. 5.

FIG. 5 is a plan view of a transmissive optical shutter 200 according to another exemplary embodiment. FIG. 6 is a cross-sectional view taken along a line B-B' of FIG. 5. Reference numerals in FIGS. 5 and 6 that are the same as reference numerals in FIGS. 1 to 4G are used to indicate elements that are substantially the same constituent elements of the transmissive optical shutter 100, and thus, a repeated description thereof will be omitted. Hereinafter, the transmissive optical shutter 200 will be described mainly in terms of its differences from the transmissive optical shutter 100.

In the transmissive optical shutter 200 according to another exemplary embodiment, second electrodes 252 have a structure different from a structure of the second electrodes 152. Electrode pads 254 are formed on a region adjacent to four cells. The second electrode 252 includes a first main electrode 252a connected to the electrode pad 254, and a second main electrode 252b and a third main electrode 252c extending in a direction towards a trench direction from both edges of the first main electrode 252a. The second main electrode 252b and the third main electrode 252c that are adjacently disposed to corresponding trenches T may be respectively disposed on a portion of an insulating frame 240 filling the trench T. The second main electrode 252b and the third main electrode 252c disposed on the trench T are formed only on the trench T, as shown in a plan view, but the exemplary embodiment is not limited thereto. As shown in a plan view, the second main electrode 252b and the third main electrode 252c disposed on the trench T may be disposed to overlap with a corresponding portion of a corresponding stack 130. Also, in a plan view, an outermost second main electrode 252*b* and an outermost third main electrode 252*c* may be formed to overlap the insulating frame 240 and the corresponding stack 130.

In each cell region, finger electrodes 252*d* extend in opposite directions such that the finger electrodes 252*d* formed on the second main electrode 252*b* extend in an opposite direction from the finger electrodes 252*d* formed on the third main electrode 252*c*. The first through third main electrodes 252*a*, 252*b*, and 252*c* may have a width greater than that of the finger electrodes 252*d*, although are not limited thereto.

In the transmissive optical shutter 200 according to an exemplary embodiment, the adjacent second main electrode 252*b* and the third main electrode 252*c* are disposed on the trench T, and thus, when compared with the transmissive optical shutter 100, a fill factor may increase, and accordingly, the efficiency of light utilization may increase.

In the transmissive optical shutter according to an exemplary embodiment, most of a second electrode is disposed on an edge of a second contact layer, and thus, the uniformity of surface resistance in the second contact layer is increased, and accordingly, uniform light is provided.

Also, according to an exemplary embodiment, the second electrode is an open type comb electrode, and thus, an EMI effect that occurs at a high driving frequency is reduced.

Also, according to another exemplary embodiment, main electrodes disposed on edges of the second contact layer are disposed on the trench, and thus, a fill factor is increased, and accordingly, the efficiency of light utilization is increased.

While one or more exemplary embodiments have been described with reference to the figures, it will be understood by those of ordinary skill in the art that various changes in form and details may be made therein without departing from the spirit and scope as defined by the following claims.

What is claimed is:

1. A transmissive optical shutter comprising:
a substrate through which light is transmitted;
a first contact layer provided on the substrate;
a plurality of stacks provided on the first contact layer, each stack of the plurality of stacks including a first reflective layer, an active layer, a second reflective layer, and a second contact layer sequentially provided on the first contact layer;
a first electrode provided on the first contact layer; and
a plurality of second electrodes respectively provided on corresponding second contact layers of the plurality of stacks, the plurality of second electrodes being configured to drive the plurality of stacks to modulate an amplitude of the light according to a driving frequency of current applied to the plurality of second electrodes,
wherein each second electrode of the plurality of second electrodes is comb-shaped.

2. The transmissive optical shutter of claim 1, further comprising an insulating frame provided on the first contact layer, wherein portions of the insulating frame are formed in trenches between side surfaces of adjacent stacks of the plurality of stacks.

3. The transmissive optical shutter of claim 2, wherein each second electrode of the plurality of second electrodes comprises:

an electrode pad provided on the insulating frame on a side of the plurality of stacks;
a first main electrode connected to the electrode pad;
a second main electrode and a third main electrode facing each other and extending parallel to each other in a first direction from respective corners of the first main electrode;
a plurality of first finger electrodes extending parallel to one another from the second main electrode towards the third main electrode; and
a plurality of second finger electrodes extending parallel to one another from the third main electrode towards the second main electrode and alternately arranged with the first finger electrodes in the first direction.

4. The transmissive optical shutter of claim 3, wherein the second main electrode and the third main electrode are respectively provided on edges of each stack of the plurality of stacks.

5. The transmissive optical shutter of claim 3, wherein the second main electrode and the third main electrode are provided directly above a trench formed between adjacent stacks of the plurality of stacks.

6. The transmissive optical shutter of claim 3, wherein a width of the first main electrode, a width of the second main electrode and a width of the third main electrode are each individually greater than individual widths of the first finger electrodes and individual widths of the second finger electrodes.

7. The transmissive optical shutter of claim 1, wherein a wavelength band of light incident to the transmissive optical shutter has a wavelength of at least 850 nm.

8. The transmissive optical shutter of claim 2, wherein an upper surface of the insulating frame, which is a surface of the insulating frame opposite to a surface of the insulating frame which contacts the first contact layer, has a height that is the same as heights of upper surfaces of the plurality of stacks, which are surfaces of the plurality of stacks opposite to surfaces of the plurality of stacks which contact the first contact layer.

9. The transmissive optical shutter of claim 1, further comprising a passivation layer provided on the second contact layer to cover the plurality of second electrodes.

10. The transmissive optical shutter of claim 1, wherein the first contact layer and the first reflective layers are doped with a first conductive type impurity, and the second contact layers and the second reflective layers are doped with a second conductive type impurity which is electrically opposite to the first conductive type impurity.

11. The transmissive optical shutter of claim 1, further comprising a supporting layer provided on a lower surface of the substrate which is a surface of the substrate opposite to a surface of the substrate on which the first contact layer is provided.

12. The transmissive optical shutter of claim 11, wherein the supporting layer is formed of glass or sapphire.

13. The transmissive optical shutter of claim 1, wherein the first electrode surrounds and is spaced apart from the plurality of stacks provided on the first contact layer.

* * * * *